(12) United States Patent
Miyauchi et al.

(10) Patent No.: US 7,662,477 B2
(45) Date of Patent: Feb. 16, 2010

(54) MULTILAYER CERAMICS SUBSTRATE

(75) Inventors: Yasuharu Miyauchi, Tokyo (JP);
Toshiyuki Suzuki, Tokyo (JP);
Masaharu Hirakawa, Tokyo (JP);
Tomoko Nakamura, Tokyo (JP);
Toshinobu Miyakoshi, Tokyo (JP);
Kiyoshi Hatanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 293 days.

(21) Appl. No.: 12/000,177

(22) Filed: Dec. 10, 2007

(65) Prior Publication Data
US 2008/0152928 A1     Jun. 26, 2008

(30) Foreign Application Priority Data
Dec. 26, 2006    (JP)  .............................. 2006-350628

(51) Int. Cl.
*B32B 15/00*     (2006.01)
(52) U.S. Cl. ........................ 428/432; 428/433; 428/457; 428/469; 428/689; 428/701; 428/697; 428/702
(58) Field of Classification Search ................ 428/432, 428/469, 701, 702, 433, 457, 689
See application file for complete search history.

(56) References Cited
FOREIGN PATENT DOCUMENTS

| | | |
|---|---|---|
| JP | U-60-013766 | 1/1985 |
| JP | A-06-237081 | 8/1994 |
| JP | A-09-221375 | 8/1997 |
| JP | A-11-135899 | 5/1999 |
| JP | A-2001-028474 | 1/2001 |
| JP | A-2002-338341 | 11/2002 |
| JP | A-2003-277852 | 10/2003 |
| JP | A-2005-216998 | 8/2005 |
| JP | A-2005-285957 | 10/2005 |

OTHER PUBLICATIONS

European Search Report issued May 27, 2009 for EP 07 02 4830.

*Primary Examiner*—Ling Xu
(74) *Attorney, Agent, or Firm*—Oliff & Berridge, PLC

(57) ABSTRACT

A highly reliable ceramics substrate which can sufficiently secure a bonding strength of a surface conductor in an initial state and after a lapse of time (e.g., after a PCT) is provided. The multilayer ceramics substrate has a surface conductor on at least one surface of a multilayer body constituted by a plurality of laminated ceramics substrate layers. A reaction phase formed by a reaction between a ceramics component in the ceramics substrate layers and a glass component in the surface conductor is deposited at an interface between the surface conductor and ceramics substrate layers. For example, an alumina filler in the ceramics substrate layers and Zn in the surface conductor react with each other, thereby forming $ZnAl_2O_4$ as the reaction phase.

3 Claims, 4 Drawing Sheets

MULTILAYER CERAMICS SUBSTRATE

BACKGROUND OF THE INVENTION

1. Field of the Invention

The present invention relates to a multilayer ceramics substrate having a surface conductor made of a sintered metal and the like on a surface.

2. Related Background Art

While substrates for mounting electronic devices have widely been in use in the fields of electronic appliances and the like, multilayer ceramics substrates have recently been proposed and put into practical use as a highly reliable substrate responding to demands for the electronic appliances to reduce their size and weight and diversify their functions. A multilayer ceramics substrate is constructed by laminating a plurality of ceramics substrate layers and enables high-density mounting by integrating surface conductors, inner conductors, electronic elements, and the like with the ceramics substrate layers.

When a surface conductor formed on an outer surface of the multilayer ceramics substrate is made of a sintered metal, a conductor paste employed is typically doped with glass frit. Doping with glass frit is effective in securing the bonding strength between the surface conductor made of the sintered metal and the ceramics substrate layer. For example, using a conductor paste containing an Ag powder (conductive material) and glass frit as a conductive paste for forming the surface conductor can secure the adhesion between the surface conductor and ceramics substrate layer to a certain extent.

For keeping the electric resistance of the surface conductor at a low value and making its solder wettability and platability favorable, the doping amount of glass fit has its limit, so that sufficient results may not always be obtained by doping with glass frit alone. Therefore, various studies have been under way in order to improve the bonding strength of the surface conductor, and it has been proposed to secure the bonding strength of the surface conductor, for example, by forming an undercoat layer or the like (see, for example, Japanese Patent Application Laid-Open Nos. HEI 6-237081 and 9-221375).

Namely, the invention described in Japanese Patent Application Laid-Open No. HEI 6-237081 forms a glass layer at the interface between a glass ceramics layer and a conductor lead on the uppermost layer by printing a glass paste, thereby attaining a high bonding strength. Similarly, the invention described in Japanese Patent Application Laid-Open No. HEI 9-221375 forms an undercoat layer containing predetermined glass and alumina between a ceramics substrate layer and a surface conductor layer, so as to secure the adhesion between the substrate and surface conductor layer.

SUMMARY OF THE INVENTION

To secure the bonding strength between the surface conductor and the ceramics substrate layer acting as an undercoat, the above-mentioned prior art mainly depends on a function of glass as an adhesive and fails to suggest any further thought. For example, the basic idea of the inventions described in Japanese Patent Application Laid-Open Nos. HEI 6-237081 and 9-221375 is to form an undercoat layer containing glass, so that a large amount of glass is present between the surface conductor and ceramics substrate layer, thereby attaining a high bonding strength.

However, the improvement in bonding strength of the surface conductor is limited when depending on the function of glass as an adhesive alone. For example, even when the adhesion strength is high in the initial state, the decrease in bonding strength due to deterioration over time is hard to suppress. While so-called PCT (Pressure Cooker Test) and the like have recently been in practice in order to evaluate the reliability of multilayer ceramics substrates, it is hard for the above-mentioned prior art to sufficiently secure the bonding strength after the PCT.

The present invention is proposed in view of such circumstances so far and aims at providing a highly reliable multilayer ceramics substrate which can sufficiently secure a bonding strength of a surface conductor not only in the initial state but also after a lapse of time (e.g., after a PCT).

For achieving the object mentioned above, the inventors conducted various studies over a long period. As a result, it has been found that, when a ceramics component contained in a ceramics substrate layer and a glass component contained in a surface conductor are selected and set to necessary concentrations, their reaction phase is formed at the interface between the ceramics substrate layer and surface conductor, which greatly contributes to improving the bonding strength. The present invention is completed according to such a totally new idea different from the prior art.

Namely, the present invention provides a multilayer ceramics substrate having a surface conductor on at least one surface of a multilayer body constituted by a plurality of laminated ceramics substrate layers, wherein a reaction phase formed by a reaction between a ceramics component in the ceramics substrate layers and a glass component in the surface conductor is deposited at an interface between the surface conductor and the ceramics substrate layers.

The multilayer ceramics substrate of the present invention secures the bonding strength between the surface conductor and ceramics substrate layers by causing a ceramics component in the ceramics substrate layers and a glass component in the ceramics substrate layers to react with each other, instead of solely depending on the function of glass as an adhesive as with the prior art. Since the reaction forms a reaction phase at the interface between the surface conductor and ceramics substrate layers, a sufficient bonding strength is maintained even after a lapse of time (after a PCT).

The present invention can provide a highly reliable multilayer ceramics substrate which can sufficiently secure the bonding strength of the surface conductor not only in the initial state but also after a lapse of time (e.g., after a PCT).

DESCRIPTION OF THE PREFERRED EMBODIMENTS

In the following, an embodiment of the multilayer ceramics substrate employing the present invention will be explained in detail with reference to the drawings.

Figure 1:
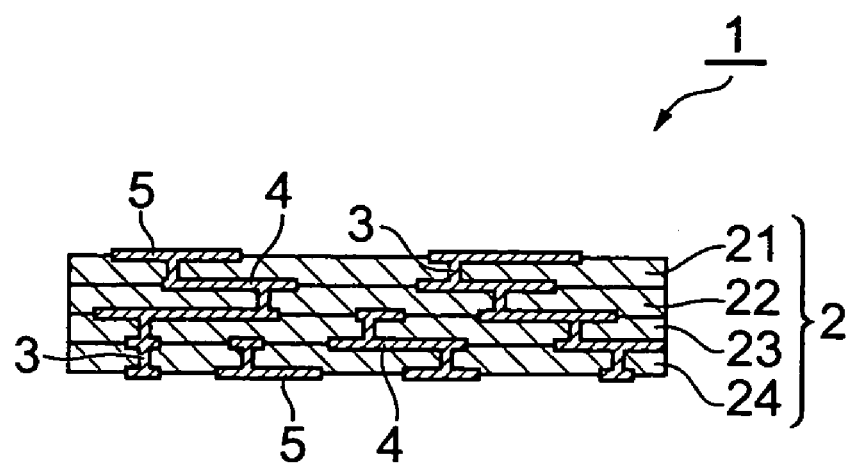
FIG. 1 is a schematic sectional view showing an example of multilayer ceramics substrate.
Figure 2:
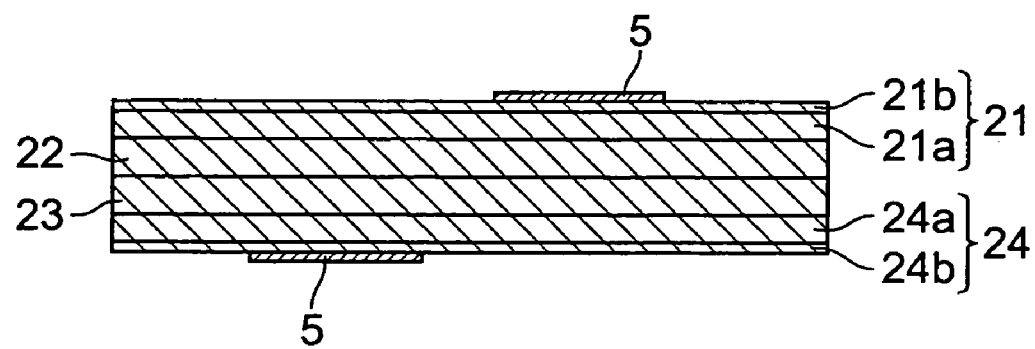
FIG. 2 is a schematic sectional view showing a structural example of ceramics substrate layers.

As shown in FIG. 1, for example, a multilayer ceramics substrate 1 is mainly composed of a multilayer body 2 constituted by a plurality of laminated ceramics substrate layers (four ceramics substrate layers 21 to 24 here), and is constructed by forming via conductors 3 penetrating through the ceramics substrate layers 21 to 24, inner conductors 4 on both sides of the ceramics substrate layers 22, 23 acting as inner layers, and surface conductors 5 on outer surfaces of the ceramics substrate layers 21, 24 acting as the outermost layers in the multilayer body 2.

Each of the ceramics substrate layers 21 to 24 is formed by adding a ceramics material such as alumina ($Al_2O_3$) to a predetermined glass composition made of glass ceramics, for example, and then firing them. Here, examples of oxides constituting the glass composition include $SiO_2$, $B_2O_3$, CaO, SrO, BaO, $La_2O_3$, $ZrO_2$, $TiO_2$, MgO, ZnO, PbO, $Li_2O$, $Na_2O$, and $K_2O$, which may be used in combination as appropriate. When the ceramics substrate layers 21 to 24 constituting the multilayer ceramics substrate 1 are made of the glass ceramics, they can be fired at a low temperature. Various ceramics materials other than the glass ceramics can also be used in the ceramics substrate layers 21 to 24 as a matter of course.

On the other hand, each of the via conductors 3, inner conductors 4, and surface conductors 5 is a sintered metal conductor formed by sintering a conductor paste. The conductor paste is mainly composed of a conductive material and is prepared by kneading it with glass components and organic vehicles. Examples of the conductive material include Ag, Au, Pd, Pt, and Cu, among which Ag is preferably employed. Using Ag as a conductive material can form a sintered metal conductor having a low resistance and suppress the manufacturing cost as compared with a case using a noble metal such as Au or Pd, for example. Cu is hard to control its firing atmosphere. When Ag is used as a conductive material, other metal components may also be contained therein as long as it is mainly composed of Ag.

Among these sintered metal conductors, the via conductors 3 are formed such that the conductive material remaining after firing the conductor paste fills via holes formed in the ceramics substrate layers 21 to 24, and function to electrically connect the inner conductors 4 and surface conductors 5 formed in the ceramics substrate layers 21 to 24 to each other, conduct heat, and so forth. The via conductors 3 typically have a substantially circular form, but may have any form such as elliptical, oval, and square forms in order to attain a large cross-sectional area within a restricted range of shape and space.

While the foregoing is the basic structure of the multilayer ceramics substrate 1, the multilayer ceramics substrate 1 of this embodiment is characterized in that a reaction phase is formed at interfaces between the surface conductors 5 and the ceramics substrate layers 21, 24 acting as undercoats. The reaction phase is formed by a reaction between a glass component contained in the surface conductors 5 and a ceramics component contained in the ceramics substrate layers 21, 24. Conversely, it is necessary for the surface conductors 5 and ceramics substrate layers 21, 24 to contain components which can react with each other so as to form the reaction phase.

Specifically, when the surface conductors 5 contain Zn while the ceramics substrate layers 21, 24 contain alumina ($Al_2O_3$), for example, they react with each other, thereby forming $ZnAl_2O_4$ as a reaction phase. The presence of $ZnAl_2O_4$ as a reaction phase can be verified by x-ray diffraction (XRD) or the like.

When forming such a reaction phase ($ZnAl_2O_4$), it is necessary for the surface conductors 5 to contain Zn as mentioned above. In order for the surface conductors 5 to contain Zn, it will be sufficient if Zn-based glass containing ZnO as one of its constituent oxides is used as a glass component of the surface conductors 5. The Zn-based glass comprises oxides such as $B_2O_3$, $SiO_2$, and MnO in addition to ZnO, while the components other than ZnO are optional. The content of Zn (ZnO) in the glass component contained in the surface conductors 5 is preferably 60 mass % to 75 mass %. When the Zn (ZnO) content is less than 60 mass %, the reaction phase may be formed insufficiently, while it is disadvantageous in that the softening point of glass becomes higher. When the Zn (ZnO) content exceeds 75 mass %, on the other hand, there is a fear of vitrification failing, which is disadvantageous.

On the other hand, it is necessary for the ceramics substrate layers 21, 24, which are used in combination with the surface conductors 5 containing Zn, to contain alumina ($Al_2O_3$), which is a component for forming a reaction phase by reacting with Zn, as a filler. Therefore, as mentioned above, it will be preferred if a glass ceramics substrate or the like having added alumina ($Al_2O_3$) as a filler to a glass composition is employed. However, the ceramics substrate layers 21, 24 are not limited to the glass ceramics substrate layers, but may be anything as long as they contain alumina ($Al_2O_3$).

When the ceramics substrate layers 21, 24 are glass ceramics substrate layers, an insulating porcelain disclosed in Japanese Patent No. 2641521, for example, is preferably employed as the glass ceramics material. A specific example of the insulating porcelain contains 30 mass % to 50 mass % of an alumina component and 70 mass % to 50 mass % of a glass component, while the glass component is composed of 46 mass % to 60 mass % of $SiO_2$, 0.5 mass % to 5 mass % of $B_2O_3$, 6 mass % to 17.5 mass % of $Al_2O_3$, and 25 mass % to 45 mass % of an alkaline earth metal oxide, wherein at least 60 mass % of the alkaline earth metal oxide is SrO.

The insulating porcelain having the composition mentioned above can form a ceramics substrate layer by sintering at a low temperature of 1000° C. or below, and exhibits various excellent characteristics such as easy controllability of crystallization, excellent resistance to migration, low dielectric constant, and high strength.

When the forming of the reaction phase is taken into consideration, however, it will be preferred if the content of alumina ($Al_2O_3$) contained as a filler in the ceramics substrate layers 21, 24 is 32 vol % or greater. When the alumina content in the ceramics substrate layers 21, 24 is less than 32 vol %, the reaction phase may not be formed sufficiently, whereby the adhesion strength of the surface conductors 5 may become insufficient. A preferred range of alumina ($Al_2O_3$) contained in the ceramics substrate layers 21, 24 is 32 vol % to 40 vol %, more preferably 34 vol % to 40 vol %, further preferably 35 vol % to 40 vol %. The alumina ($Al_2O_3$) content of 32 vol % or higher in the ceramics substrate layers 21, 24 can yield an initial back pressure resistance of 50 N or greater and a back pressure resistance of 30 N or greater after a PCT. When the content is 34 vol % or greater, the back pressure resistance after the PCT can become 50 N or greater. When the content is 35 vol % or greater, the difference in resistance (deterioration ratio) between before and after the PCT can be suppressed to 15% or less. The alumina content in the ceramics substrate layers 21, 24 is preferably 40 vol % or less, since the sintering may become insufficient if the content exceeds 40 vol %.

In order for the alumina content in the ceramics substrate layers 21, 24 to fall within the above-mentioned range, it will be sufficient if an insulating porcelain (glass ceramics) having a satisfactory composition is used in the ceramics substrate layers 21, 24 themselves. This, however, will restrict dielectric characteristics of the ceramics substrate layers 21, 24 and the like. Effective in avoiding this is constructing the ceramics substrate layer 21 (or ceramics substrate 24) from a substrate part 21a (24a) to become a main part and a surface layer part 21b (24b) in contact with the surface conductor 5 and designing the surface layer part 21b (24b) such as to increase its alumina content and attain the above-mentioned composition range. This two-layer structure allows the substrate part 21a (24a) to change its composition freely in view of dielectric characteristics and the like, while causing the surface layer part 21b to contain a greater amount of alumina so that a reaction phase can sufficiently be deposited on the interface with the surface conductor 5.

The reaction phase deposited on the interface between the ceramics substrate 21, 24 and surface conductor 5 is not limited to $ZnAl_2O_4$. Similar effects can also be obtained when various reaction phases are deposited on the interface. It will be sufficient if the surface conductor 5 and ceramics substrate layer 21, 24 have respective components which can form a reaction phase by reacting with each other.

The multilayer ceramics substrate 1 in accordance with this embodiment, in which the reaction phase ($ZnAl_2O_4$) is formed at the interface between the surface conductor 5 and ceramics substrate layer 21, 24, can secure a greater bonding strength as compared with the bonding solely depending on the adhesion of glass, and can restrain the strength from decreasing with time after the PCT and the like. Therefore, a highly reliable multilayer ceramics substrate can be provided.

A method of manufacturing the multilayer ceramics substrate 1 will now be explained. Though a manufacturing method based on a nonshrinking process will be explained here, this is not always restrictive. For example, shrinkage suppression may be omitted.

Figure 3:
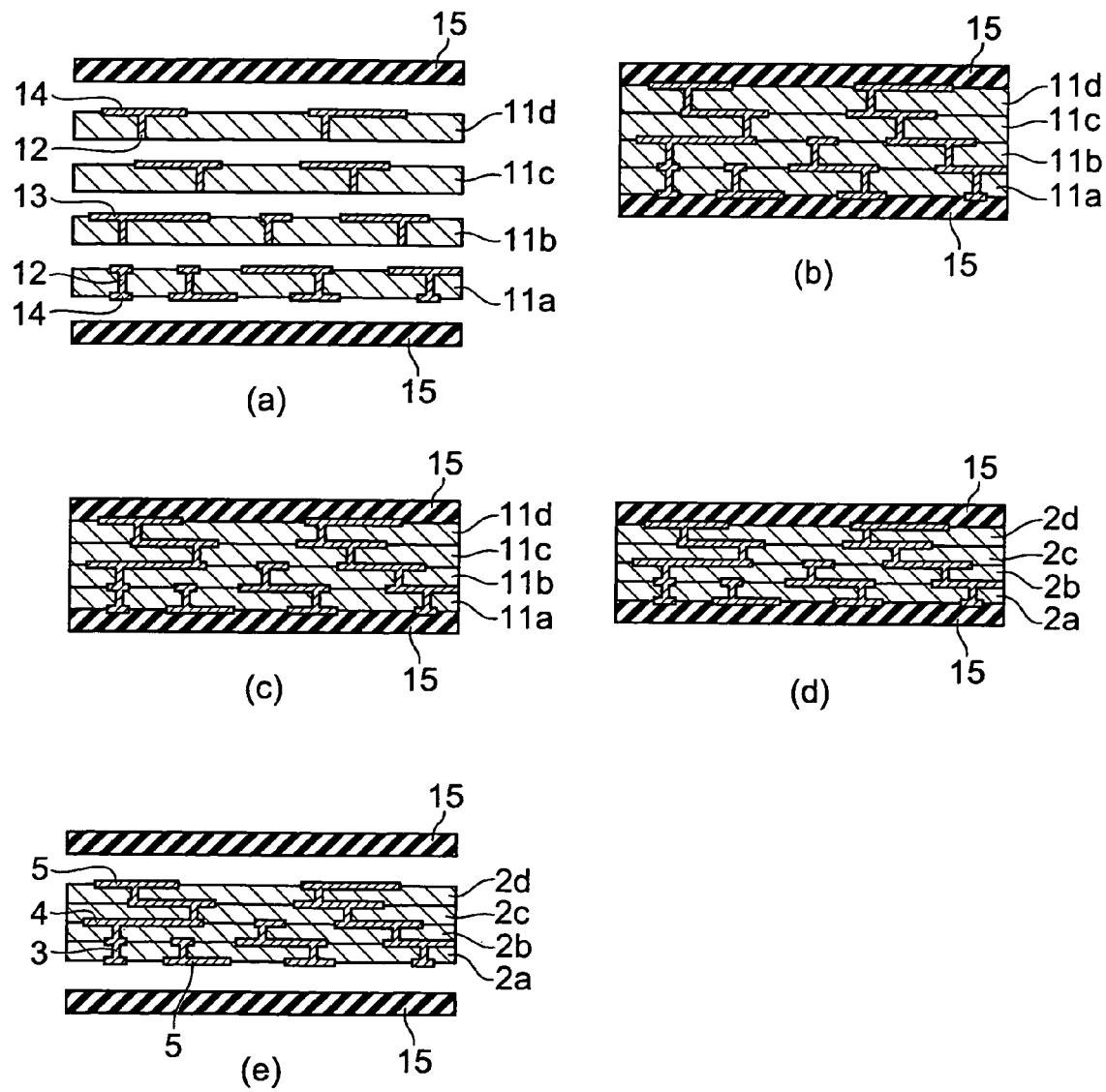
FIG. 3 is a schematic sectional view showing processes of making the multilayer ceramics substrate, in which (a) is a glass ceramics green sheet and inner conductor forming step, (b) is a temporary stacking step, (c) is a pressing step, (d) is a firing step, and (e) is a shrinkage suppressing green sheet peeling step.

For making the multilayer ceramics substrate 1, ceramics green sheets 11a to 11d which will become respective ceramics substrate layers 21 to 24 after firing are initially prepared as shown in FIG. 3(a). For making the ceramics green sheets 11a to 11d, an oxide powder (glass ceramics powder or the like) and an organic vehicle are mixed, so as to yield a slurry dielectric paste, which is then spread on a support such as polyethylene terephthalate (PET) sheet, for example, by doctor blading or the like. As the organic vehicle, any of known organic vehicles can be used. For forming the reaction phase ($ZnAl_2O_4$), it is necessary for the glass ceramic powder to contain a predetermined amount of alumina as filler. Alternatively, among the ceramics green sheets 11a to 11d, the ceramics green sheets 11a, 11d in contact with surface conductor patterns which will be explained later may have two-layer structures, so as to increase the alumina content in the parts in contact with the surface conductor patterns.

After forming the ceramics green sheets 11a to 11d, through holes (via holes) are formed at predetermined positions. Each via hole is typically formed as a circular hole, and is filled with a conductor paste 12, whereby a via conductor is formed. Further, a conductor paste is printed in predetermined patterns on the ceramics green sheets 11b, 11c to become inner layers, so as to form inner conductor patterns 13.

The conductor paste 12 filling the via holes and the conductor paste used for forming the inner conductor patterns 13 are formed by kneading a conductive material made of various conductive metals such as Ag, Au, and Cu or alloys with an organic vehicle, for example. The organic vehicle is mainly composed of a binder and a solvent, and is typically compounded with the conductive material such that the binder and solvent are 1 to 15 mass % and 10 to 50 mass %, respectively, though its composition ratio to the conductive material and the like are arbitrary. The conductor paste may be doped with additives selected from various dispersants, plasticizers, and the like as necessary.

On the other hand, surface conductor patterns 14 are formed such as to be directly in contact with the ceramics green sheets 11a, 11d arranged on the outermost sides. Employed for forming the surface conductor patterns 14 is a conductor paste containing, as a glass component, a component (Zn) which can form a reaction phase with a component (alumina) contained in the ceramics green sheets 11a, 11d.

After being filled with the conductor paste 12 and formed with the inner conductor patterns 13 and surface conductor patterns 14, the ceramics green sheets 11a to 11d are stacked into a multilayer body as shown in FIG. 3(b). Here, firing is performed with shrinkage suppressing green sheets 15 arranged as constraining layers on both sides (outermost layers) of the multilayer body.

Employed as the shrinkage suppressing green sheets 15 to become the constraining layers are compositions containing materials which are not shrinkable at the firing temperature of the ceramics green sheets 11a to 11d, such as tridymite, cristobalite, silica, molten silica, alumina, mullite, zirconia, aluminum nitride, boron nitride, magnesium oxide, and silicon carbide, for example. The multilayer body is held between the shrinkage suppressing green sheets 15 and fired, thereby being restrained from shrinking in in-plane directions.

After a so-called temporary stacking state of the multilayer body shown in FIG. 3(b), pressing is performed as shown in FIG. 3(c), and then firing is effected as shown in FIG. 3(d).

When tridymite is used as a shrinkage suppressing material for the shrinkage suppressing green sheets 15, the latter naturally peel off because of a difference in thermal expansion after the firing as shown in FIG. 3(e), whereby the multilayer ceramics substrate 1 is obtained. When a material other than tridymite is used as the shrinkage suppressing material, the multilayer ceramic substrate 1 will similarly be obtained if a residue removing step for removing the residue after firing is additionally performed.

In thus obtained multilayer ceramics substrate 1, the ceramics green sheets 11a to 11d become the ceramics substrate layers 21 to 24, while the conductor paste 12 within the via holes becomes the via conductors 3. Similarly, the inner conductor patterns 13 become the inner conductors 4. While the surface conductor patterns 14 become the surface conductors 5, a reaction phase ($ZnAl_2O_4$) is formed at the interfaces between the surface conductors 5 formed and ceramics substrate layers 21, 24, whereby a bonding strength is secured.

EXAMPLE 1

A specific example employing the present invention will now be explained with reference to results of an experiment.

Forming of Reaction Phase

A multilayer ceramics substrate was made in conformity to the above-mentioned embodiment In the making, surface conductor patterns for forming surface conductors were constructed by a conductor paste containing ZnO. On the other hand, glass ceramics sheets containing alumina ($Al_2O_3$) as a filler were used for forming the ceramics substrate layers.

Figure 4:
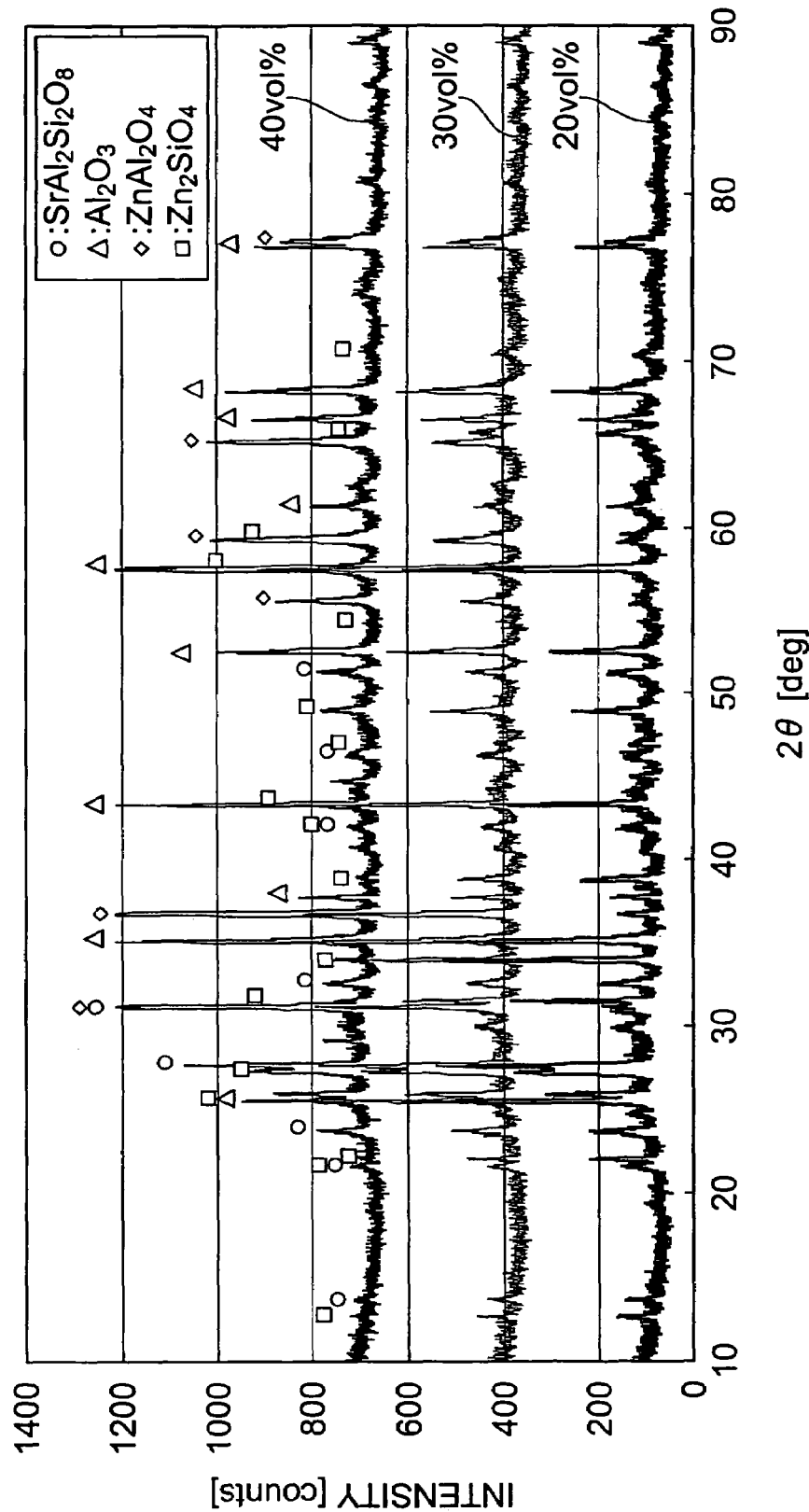
FIG. 4 is a property chart showing results of x-ray diffraction analyses of interfaces between surface conductors and ceramics substrate layers.

While varying the alumina filler content in the glass ceramics sheets among 20 vol %, 30 vol %, and 40 vol %, the interfaces between the surface conductors and ceramics substrate layers after firing were analyzed in terms of x-ray diffraction. For measurement, the surface conductors were peeled off, and the surfaces of ceramics substrate layers after peeling were subjected to x-ray diffraction. FIG. 4 shows the results. It was found that the reaction phase ($ZnAl_2O_4$) was formed at the interfaces between the surface conductors and ceramics substrate layers and that peaks of the resulting reaction phase ($ZnAl_2O_4$) increased (i.e., the amount of reaction phase increased) as the content of alumina in the glass ceramics sheets increased.

Evaluation of Back Pressure Resistance

For each of multilayer ceramics substrates made, the back pressure resistance of the surface conductors was evaluated. The back pressure resistance was measured before and after a PCT, and the deterioration ratio after the PCT was calculated. The PCT was performed under a condition with a pressure of 2 atmospheres, a temperature of 121° C., a relative humidity of 96%, and a time of 60 hours.

For measuring the back pressure resistance, a conductor having a diameter of 1.0 mm was formed on the surface of each ceramics substrate layer and soldered onto a conductor of a printed board for evaluation. The printed board and ceramics substrate layers were secured with their respective jigs, the ceramics substrate layers were peeled off at a constant speed while being pressed from their back, and the stress at the time when they were destroyed was taken as back pressure resistance. Table 1 shows the results.

TABLE 1

| $Al_2O_3$ filler content (vol %) | Back pressure resistance (N) | | Deterioration ratio (%) |
|---|---|---|---|
| | Before PCT | After PCT | |
| 20 | 40.3 | 11.3 | 72.0 |
| 25 | 46.3 | 11.6 | 74.9 |
| 30 | 50.1 | 10.5 | 79.0 |
| 32 | 66.2 | 32.2 | 51.4 |
| 34 | 65.8 | 52.8 | 19.8 |
| 35 | 66.1 | 56.2 | 15.0 |
| 36 | 57.8 | 52.0 | 10.0 |
| 38 | 52.4 | 59.5 | −13.5 |
| 40 | 70.9 | 68.9 | 2.8 |
| 45 | failed to sinter | failed to sinter | — |

As can be seen from Table 1, the alumina filler content of 32 vol % or higher yielded a back pressure resistance of 30 N or greater and drastically lowered the deterioration ratio in bonding strength after the PCT. In particular, the alumina filler content of 34 vol % or higher yielded a back pressure resistance of 50 N or greater, while the alumina filler content of 35 vol % or higher achieved a deterioration ratio of 15% or less. The alumina filler content exceeding 40 vol %, however, caused a problem of failing to sinter.

What is claimed is:

1. A multilayer ceramics substrate having a surface conductor on at least one surface of a multilayer body constituted by a plurality of laminated ceramics substrate layers,
   wherein a reaction phase formed by a reaction between a ceramics component in the ceramics substrate layers and a glass component in the surface conductor is deposited at an interface between the surface conductor and the ceramics substrate layers,
   wherein at least a ceramics substrate layer in contact with the surface conductor is formed from glass ceramics containing $Al_2O_3$ as a filler component, while the surface conductor contains Zn as a glass component,
   wherein the multilayer ceramics substrate contains $ZnAl_2O_4$ as the reaction phase, and
   wherein the ceramics substrate layer in contact with the surface conductor has an $Al_2O_3$ content of at least 34 vol % but not greater than 40 vol % in at least a part in contact with the surface conductor.

2. A multilayer ceramics substrate according to claim 1, wherein, in the ceramics substrate layer in contact with the surface conductor, at least a part in contact with the surface conductor has an $Al_2O_3$ content greater than that in the other part.

3. A multilayer ceramics substrate according to claim 2, wherein the ceramics substrate layer in contact with the surface conductor has a surface glass ceramics layer on a side in contact with the surface conductor, the surface glass ceramics layer having an $Al_2O_3$ content of at least 34 vol % but not greater than 40 vol %.

* * * * *